(12) United States Patent
Ovsiannikov (10) Patent No.: US 7,920,185 B2
(45) Date of Patent: Apr. 5, 2011

(54) SHIELDING BLACK REFERENCE PIXELS IN IMAGE SENSORS

(75) Inventor: Ilia Ovsiannikov, Studio City, CA (US)

(73) Assignee: Micron Technology, Inc., Boise, ID (US)

( * ) Notice: Subject to any disclaimer, the term of this patent is extended or adjusted under 35 U.S.C. 154(b) by 1511 days.

(21) Appl. No.: 10/879,170

(22) Filed: Jun. 30, 2004

(65) Prior Publication Data

US 2006/0012838 A1    Jan. 19, 2006

(51) Int. Cl.
*H04N 9/64* (2006.01)
*H01L 27/00* (2006.01)
*H01L 31/00* (2006.01)

(52) U.S. Cl. .............. 348/245; 250/208.1; 250/214.1

(58) Field of Classification Search .......... 348/245; 250/208.1, 214.1
See application file for complete search history.

(56) References Cited

U.S. PATENT DOCUMENTS

| | | | |
|---|---|---|---|
| 3,786,264 A | 1/1974 | Ferro et al. | |
| 3,959,646 A | 5/1976 | DE Cremoux | |
| 4,227,098 A | 10/1980 | Brown et al. | |
| 5,013,904 A | 5/1991 | Muro | |
| 5,200,639 A | 4/1993 | Ishizuka et al. | |
| 5,214,272 A | 5/1993 | Ueno | |
| 5,553,616 A | 9/1996 | Ham et al. | |
| 5,838,469 A | 11/1998 | Campbell et al. | |
| 6,198,087 B1 | 3/2001 | Boon | |
| 6,297,070 B1 | 10/2001 | Lee et al. | |
| 6,344,877 B1 | 2/2002 | Gowda et al. | |
| 6,355,965 B1 * | 3/2002 | He et al. | 257/431 |
| 6,365,926 B1 | 4/2002 | Guidash | |
| 6,465,859 B1 | 10/2002 | Fujiwara et al. | |
| 6,611,037 B1 | 8/2003 | Rhodes | |
| 6,653,617 B2 | 11/2003 | Hiyama et al. | |
| 6,707,495 B1 | 3/2004 | Harada | |
| 6,721,005 B1 | 4/2004 | Higuchi | |
| 6,723,994 B2 | 4/2004 | Akahori | |
| 6,724,022 B1 | 4/2004 | Yoshida | |
| 6,760,073 B1 | 7/2004 | Nakashiba | |
| 6,818,930 B2 | 11/2004 | Mouli et al. | |
| 7,002,231 B2 * | 2/2006 | Rhodes et al. | 257/446 |
| 7,015,448 B2 * | 3/2006 | Barna | 250/208.1 |

(Continued)

FOREIGN PATENT DOCUMENTS

JP    02203966 A    8/1990

(Continued)

OTHER PUBLICATIONS

U.S. Appl. No. 10/768,652, filed Feb. 2, 2004, Rhodes et al.

*Primary Examiner* — David L Ometz
*Assistant Examiner* — Dillon Durnford-Geszvain
(74) *Attorney, Agent, or Firm* — Dickstein Shapiro LLP (57) ABSTRACT

An image sensor having an array of pixel cells, each including a photo-conversion device. The array has first, second, and third groups of pixel cells. The first group of pixel cells receives light and the second and third groups are shielded from light. Each pixel cell of the second group is configured to output a black reference signal for determining a black level of the array. Each pixel cell of the third group has at least one first transistor coupled to the photo-conversion device, and each transistor coupled to the photo-conversion device has a gate coupled to a power supply voltage.

9 Claims, 10 Drawing Sheets

U.S. PATENT DOCUMENTS

| | | |
|---|---|---|
| 7,053,458 B2 | 5/2006 | Mann et al. |
| 7,078,751 B2 | 7/2006 | Watanabe |
| 7,172,922 B2 | 2/2007 | Benjamin et al. |
| 7,349,018 B2 * | 3/2008 | Doering et al. ............... 348/308 |
| 2001/0043274 A1 | 11/2001 | Shepherd et al. |
| 2002/0048837 A1 | 4/2002 | Burke et al. |
| 2003/0201518 A1 | 10/2003 | Mann et al. |
| 2004/0000681 A1 | 1/2004 | Shinohara et al. |
| 2004/0094784 A1 | 5/2004 | Rhodes et al. |
| 2004/0173799 A1 | 9/2004 | Patrick |
| 2004/0251481 A1 | 12/2004 | Rhodes |
| 2005/0248673 A1 * | 11/2005 | Fowler ............................ 348/308 |
| 2006/0022231 A1 | 2/2006 | Rhodes |
| 2006/0049432 A1 | 3/2006 | Rhodes et al. |
| 2006/0261251 A1 * | 11/2006 | Fossum ....................... 250/208.1 |
| 2006/0284222 A1 | 12/2006 | Hong et al. |
| 2007/0063301 A1 | 3/2007 | Rhodes et al. |

FOREIGN PATENT DOCUMENTS

| | | |
|---|---|---|
| JP | 04-091472 | 3/1992 |
| JP | 05129572 A | 5/1993 |
| JP | 05244513 A | 9/1993 |

* cited by examiner

SHIELDING BLACK REFERENCE PIXELS IN IMAGE SENSORS

FIELD OF THE INVENTION

The present invention relates to the field of semiconductor devices, particularly to improved isolation techniques for image sensors.

BACKGROUND OF THE INVENTION

An image sensor generally includes an array of pixel cells. Each pixel cell includes a photo-conversion device for converting light incident on the array into electrical signals. An image sensor also typically includes peripheral circuitry for controlling devices of the array and for converting the electrical signals into a digital image.

Figure 1:
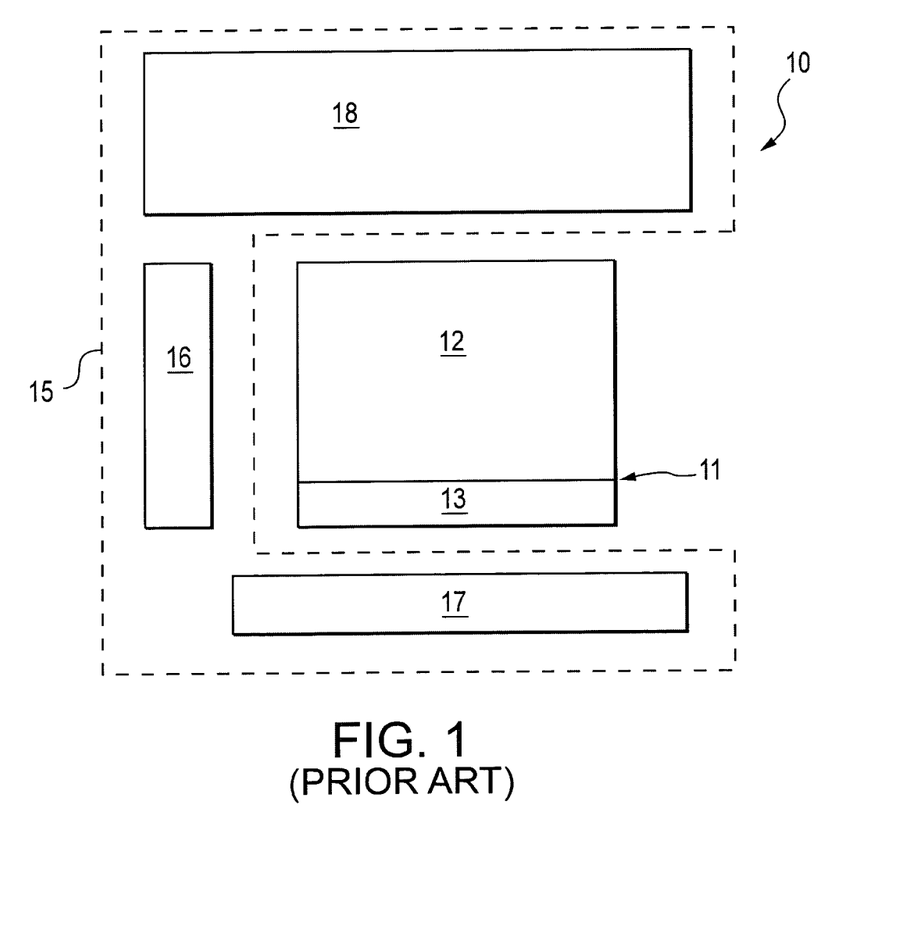
FIG. 1 is a top plan view block diagram of a conventional image sensor.
Figure 2A:
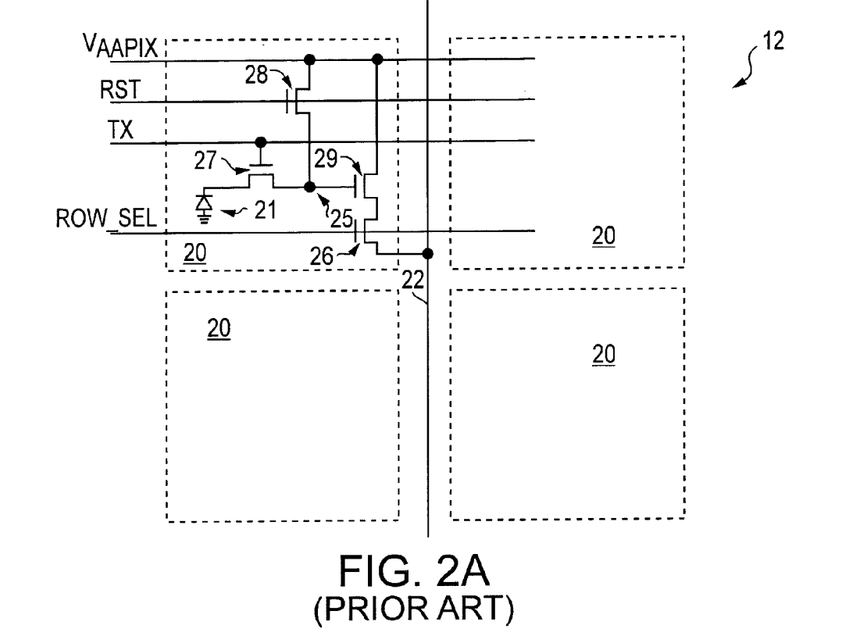
FIG. 2A is a schematic diagram of conventional CMOS pixel cells.
Figure 2B:
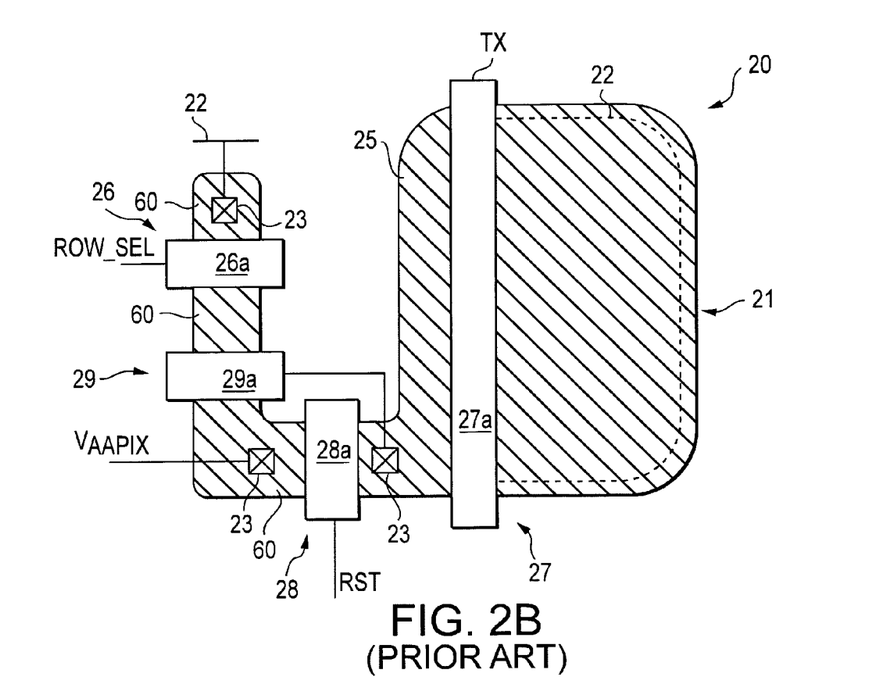
FIG. 2B is a top plan view of a pixel cell of FIG. 2A.

FIG. 1 is a top plan view block diagram of a portion of a typical CMOS image sensor 10. The image sensor 10 includes an array 11 of pixel cells arranged in columns and rows (not shown). The array 11 includes pixel cells 20 (FIG. 2A) in an active array region 12 and pixel cells 20' in a black region 13. FIG. 2A is a schematic diagram of typical pixel cells 20 and FIG. 2B is a top plan view of a pixel cell 20. The black pixel cells 20' have the same structure and operate in a similar manner to the active array pixel cells 20. Accordingly, black pixel cells 20' can be configured as shown in FIG. 2A.

The black region 13 is similar to the active array region 12, except that light is prevented from reaching the photo-conversion devices of the black pixel cells 20' by, for example, a metal layer, a black color filter array, or any opaque material (not shown). Signals from black pixel cells 20' can be used to determine the black level for the array 11, which is used to adjust the resulting image produced by the image sensor 10.

The pixel cells 20 illustrated in FIGS. 2A and 2B are typical CMOS four-transistor (4T) pixel cells. Typically, the pixel cells 20 are formed at a surface of a substrate (not shown). The substrate is doped to a first conductivity type, e.g., p-type and is biased at a ground potential. As is known in the art, a pixel cell 20 functions by receiving photons of light and converting those photons into charge carried by electrons. For this, each one of the pixel cells 20 includes a photo-conversion device 21, which is shown as a pinned photodiode, but can be a photogate, photoconductor, or other photosensitive device. The photodiode 21 includes an n-type photodiode charge accumulation region 22 and a p-type surface layer (not shown).

Each pixel cell 20 also includes a transfer transistor 27, which receives a transfer control signal TX at its gate 27a. The transfer transistor 27 is connected to the photodiode 21 and a floating diffusion region 25. During operation, the TX signal operates the transfer transistor 27 to transfer charge from the photodiode charge accumulation region 22 to the floating diffusion region 25.

The pixel cell 20 further includes a reset transistor 28, which receives a reset control signal RST at its gate 28a. The reset transistor 28 is connected to the floating diffusion region 25 and includes a source/drain region 60 coupled to a voltage supply, Vaa-pix, through a contact 23. In response to the RST signal the reset transistor 28 operates to reset the diffusion region 25 to a predetermined charge level, Vaa-pix.

A source follower transistor 29 has a gate 29a coupled to the floating diffusion region 25 through a contact 23 that receives and amplifies a charge level from the diffusion region 25. The source follower transistor 29 also includes a first source/drain region 60 coupled to the power supply voltage, Vaa-pix, and a second source/drain region 60 connected to a row select transistor 26. The row select transistor 26 receives a row select control signal ROW_SEL at its gate 26a. In response to the ROW_SEL signal, the row select transistor 26 couples the pixel cell 20 to a column line 22, which is coupled to a source/drain region 60 of the row select transistor 26. When the row select gate 26a is operated, an output voltage is output from the pixel cell 20 through the column line 22.

Referring again to FIG. 1, after pixel cells of array 11 generate charge in response to incident light, electrical signals indicating charge levels are read out and processed by circuitry 15 peripheral to array 11. Peripheral circuitry 15 typically includes row select circuitry 16 and column select circuitry 17 for activating particular rows and columns of the array 11; and other peripheral circuitry 18, which can include analog signal processing circuitry, analog-to-digital conversion circuitry, and digital logic processing circuitry. Peripheral circuitry 15 can be located adjacent to the array 11, as shown in FIG. 1.

In order to obtain a high quality image, it is important to obtain an accurate black level for the array 11. One problem encountered in the conventional image sensor 10 is interference from the active array region 12 with the black region 13. When very bright light is incident on active array pixel cells 20 adjacent to the black region 13, blooming can occur and excess charge from the active array pixel cells 20 can travel to and interfere with black pixel cells 20' in the adjacent black region 13. Additionally, excess charge from adjacent circuitry, e.g., peripheral circuitry 15, can travel to and interfere with pixel cells 20' in the adjacent black region 13. This can cause inaccurate black levels and distortion of the resultant image.

Figure 2C:
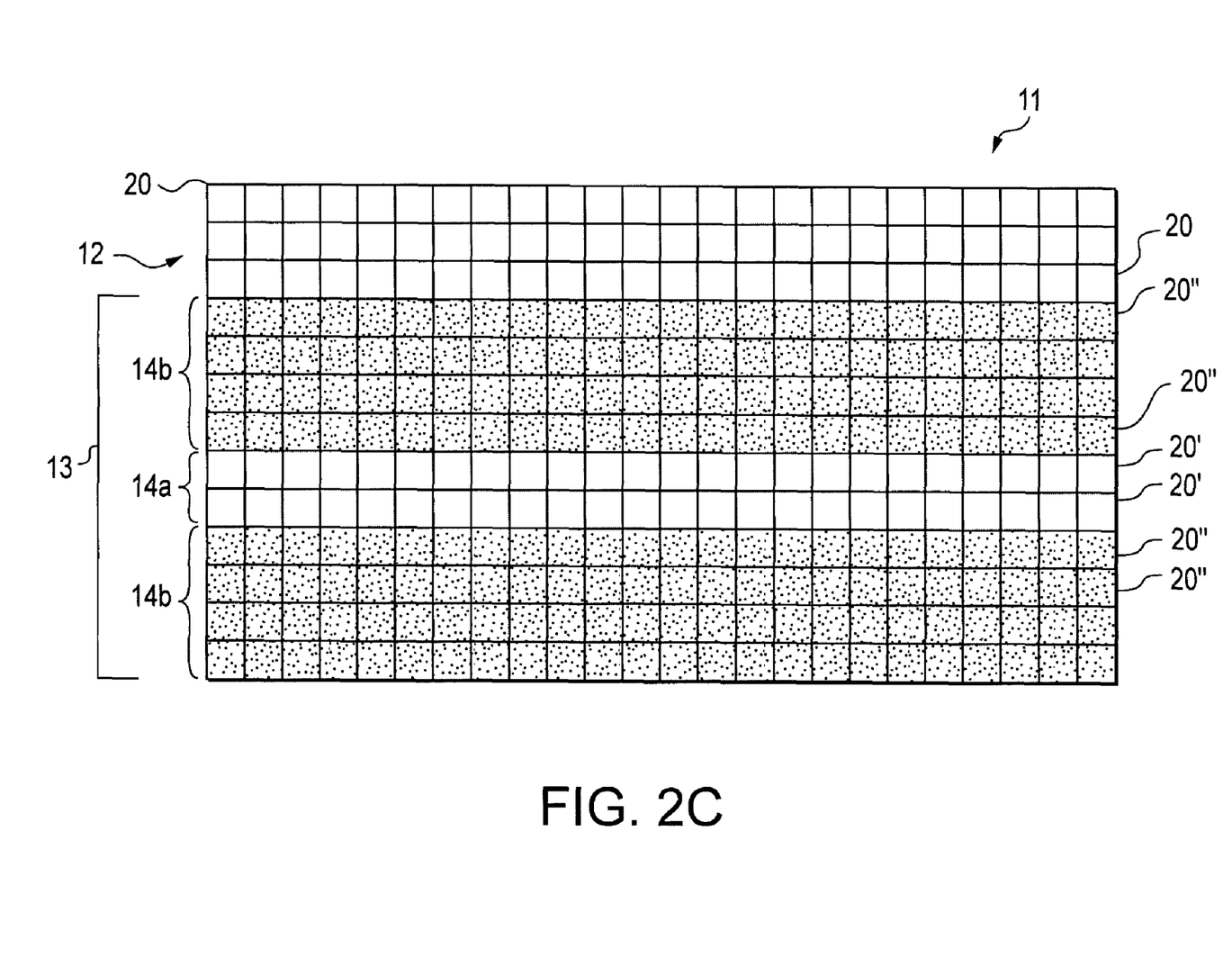
FIG. 2C is a block diagram of a portion of the image sensor of FIG. 1.

One solution to the above noted problem is to provide buffer pixel cells 20'' within the black region 13 and adjacent the black pixel cells 20', as shown in FIG. 2C. FIG. 2C depicts a portion of rows of the array 11. Typically, the buffer pixel cells 20'' have a similar structure to the black pixel cells 20' and the active array pixel cells 20. During operation of the image sensor 10, the signal output from the buffer pixel cells 20'' is discarded. As shown in FIG. 2C, multiple rows 14b of buffer pixel cells 20'' are provided flanking (i.e., on two sides) the rows 14a of black pixel cells 20'. In this manner, the buffer pixel cells 20'' act as a spacer to distance black pixel cells 20' from active array pixel cells 20 and other devices that can cause interference. Even with buffer pixel cells 20'', however, interference with black pixel cells still occurs.

Accordingly, it would be advantageous to have an improved image sensor with reduced interference between active and black pixel cells.

BRIEF SUMMARY OF THE INVENTION

Exemplary embodiments of the invention include an image sensor having an array of pixel cells, each including a photo-conversion device. The array has first, second, and third groups of pixel cells. The first group of pixel cells receives light and the second and third groups are shielded from light. Each pixel cell of the second group is configured to output a black reference signal for determining a black level of the array. Each pixel cell of the third group has at least one first transistor coupled to the photo-conversion device, and each transistor coupled to the photo-conversion device has a gate coupled to a power supply voltage.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal.

Figure 3:
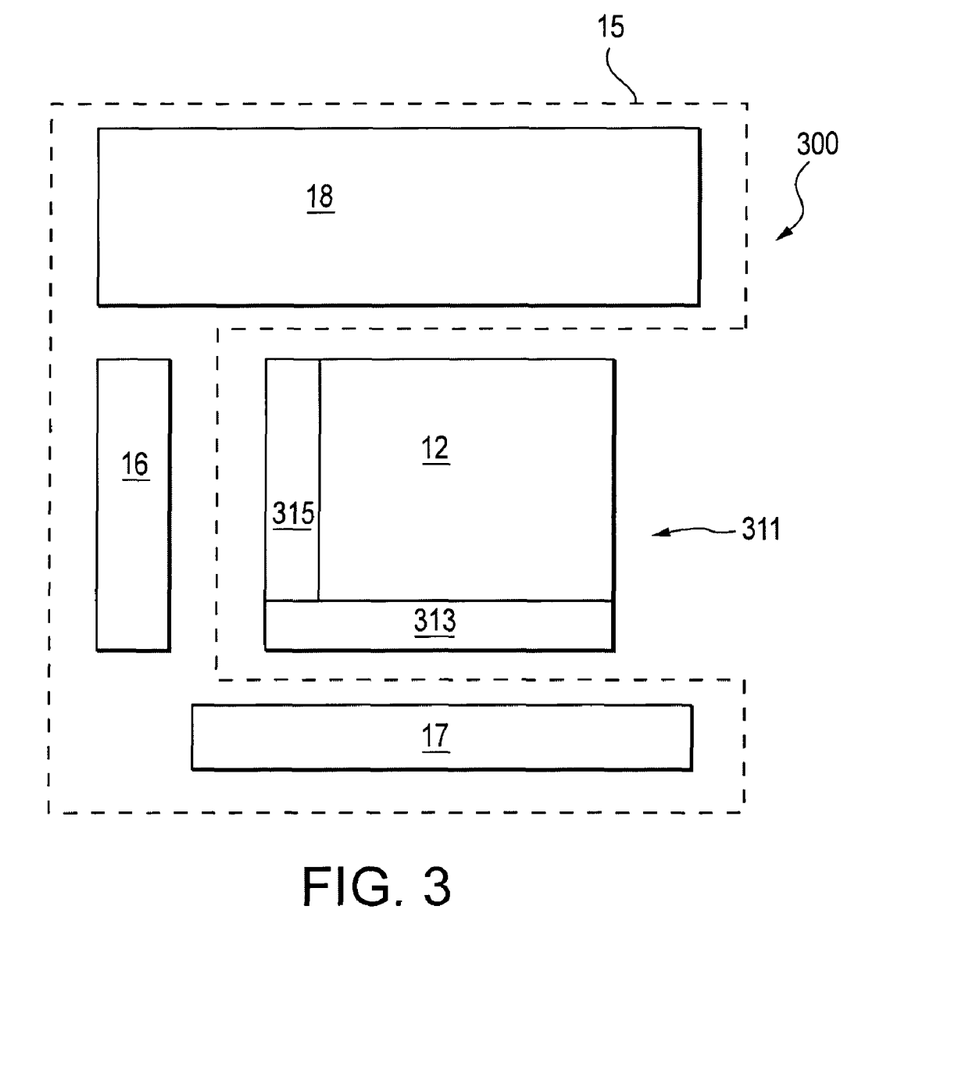
FIG. 3 is a top plan block diagram of an image sensor according to an exemplary embodiment of the invention.

Referring to the drawings, FIG. 3 depicts an image sensor 300 according to an exemplary embodiment of the invention. Image sensor 300 includes a pixel array 311 comprising an active array region 12 and two black regions 313, 315. Light is prevented from reaching pixel cells of the black regions 313, 315 by, for example, a metal layer, a black color filter array, or any opaque material (not shown).

There is also peripheral circuitry 15 adjacent to the array 311. As shown in FIG. 3, the peripheral circuitry can include row select circuitry 16 and column select circuitry 17 for activating particular rows and columns of the array 11; and other peripheral circuitry 18, which can include analog signal processing circuitry, analog-to-digital conversion circuitry, and digital logic processing circuitry. The configuration of image sensor 300 is exemplary only. Accordingly, image sensor 300 need not include peripheral circuitry 15 adjacent to the array 311.

Figure 4A:
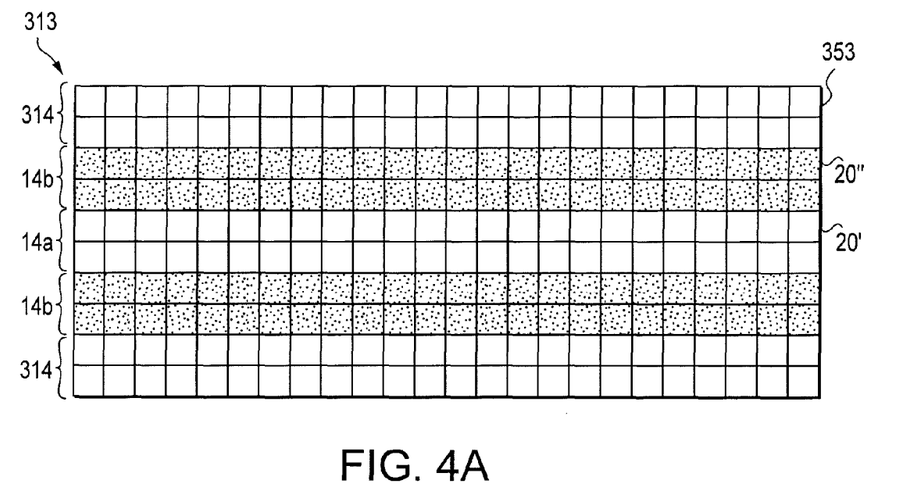
FIGS. 4A and 4B are block diagrams of portions of the image sensor of FIG. 3.
Figure 4B:
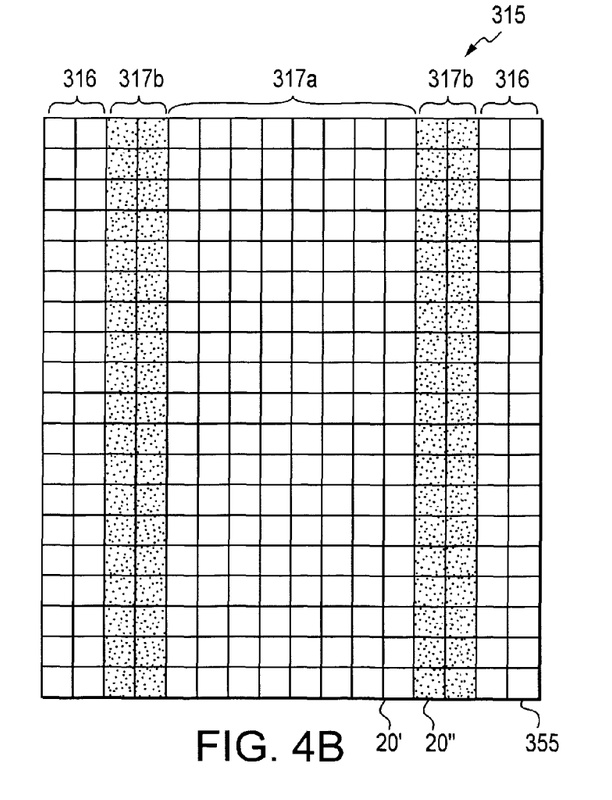

FIG. 4A depicts a portion of the black region 313, and FIG. 4B depicts a portion of the black region 315. Like black region 13 (FIG. 1), the illustrated black regions 313, 315 include black pixel cells 20'. Preferably, the black regions 313, 315 also include buffer pixel cells 20". The first black region 313 includes guard row pixel cells 353, and the second black region 315 includes guard column pixel cells 355. Light is prevented from reaching the photo-conversion devices 21 of the pixel cells 20', 20", 353, 355 in the black regions 313, 315 by, for example, a metal layer, a black color filter array, or any opaque material (not shown).

As shown in FIG. 4A, the first black region 313 includes rows 314 of guard row pixel cells 353, rows 14a of black pixel cells 20', and rows 14b of buffer pixel cells 20". There can be any number of rows 14a, 14b, 314. Preferably, there are between approximately two and approximately twenty rows 314 of guard row pixel cells 353. Preferably, the rows 14b, 314 flank the rows 14a of black pixel cells 20', as shown in FIG. 4A. It is also preferable that the buffer pixel cells 20" are between the guard pixel cells 353 and black pixel cells 20'.

Although FIG. 4A shows an equal number of buffer pixel cells 20" and guard row pixel cells 353 above and below the rows 14a of black pixel cells 20', embodiments of the invention include an image sensor 300 having different numbers of buffer pixel cells 20" and/or guard row pixel cells 353 above the black pixel cells 20' than are below the black pixel cells 20'. Additionally, embodiments of the invention include an image sensor 300, having buffer pixel cells 20" and/or guard row pixel cells 353 only on one side of the black pixel cells 20'.

Figure 5A:
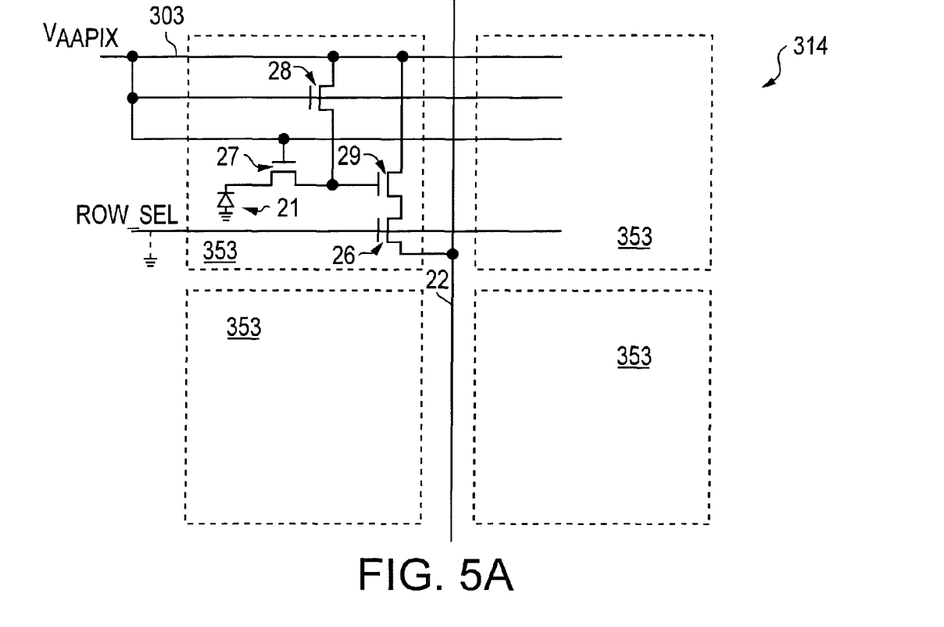
FIG. 5A is a schematic diagram of pixel cells of FIG. 4A according to an exemplary embodiment of the invention.
Figure 5B:
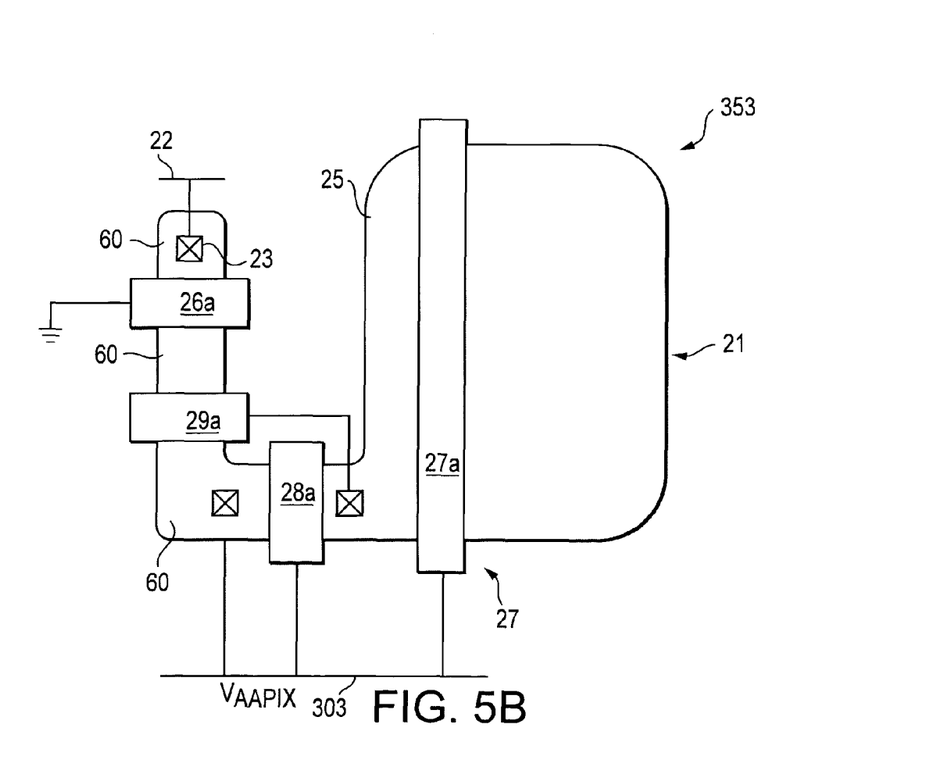
FIG. 5B is a top plan view of a pixel cell of FIG. 5A.

FIG. 5A is a schematic diagram of rows 314, including a detailed diagram of a guard row pixel cell 353; FIG. 5B is a top plan view of a guard row pixel cell 353. Similar to a conventional active array pixel cell 20, each guard row pixel cell 353 includes a transfer transistor 27, a floating diffusion region 25, a reset transistor 28, a source follower transistor 29, and a row select transistor 26. The guard row pixel cell 353, however, includes different connections and, therefore, operates differently than active array pixel cell 20 as described in more detail below.

As shown in FIGS. 5A and 5B, the gates 27a, 28a of the transfer and reset transistors 27, 28 are coupled to a power supply voltage (Vaa-pix) rail 303. This is in contrast to the active array pixel cells 20 (FIGS. 2A and 2B), where the gates 27a, 28a of the transfer and reset transistors 27, 28 receive TX and RST signals, respectively. Since all pixel cells in the guard rows 314 are guard pixel cells 353, connections (e.g., metal lines) are not needed to provide TX and RST signals to the rows 314. Also, if desired, the gate of the row select transistor 26 can be coupled to a ground potential.

As shown in FIG. 4B, the black region 315 includes columns 317a of black pixel cells 20', columns 317b of buffer pixel cells 20", and columns 316 of guard column pixel cells 355. There can be any number of columns 317a, 317b, 316. Preferably, there are between approximately two and approximately twenty columns 316 of guard column pixel cells 355. Preferably, the columns 317b, 316 flank the columns 14a of black pixel cells 20', as shown in FIG. 4B. It is also preferable that the buffer pixel cells 20" are between the guard pixel cells 355 and black pixel cells 20'.

Although FIG. 4B shows an equal number of buffer pixel cells 20" and guard column pixel cells 355 on each side of the columns 317a of black pixel cells 20', embodiments of the invention include an image sensor 300 having different numbers of buffer pixel cells 20" and/or guard column pixel cells 355 on one side of the black pixel cells 20' than are on the other side of the black pixel cells 20'. Additionally, embodiments of the invention include an image sensor 300, having buffer pixel cells 20" and/or guard column pixel cells 355 only on one side of the black pixel cells 20'.

Figure 5C:
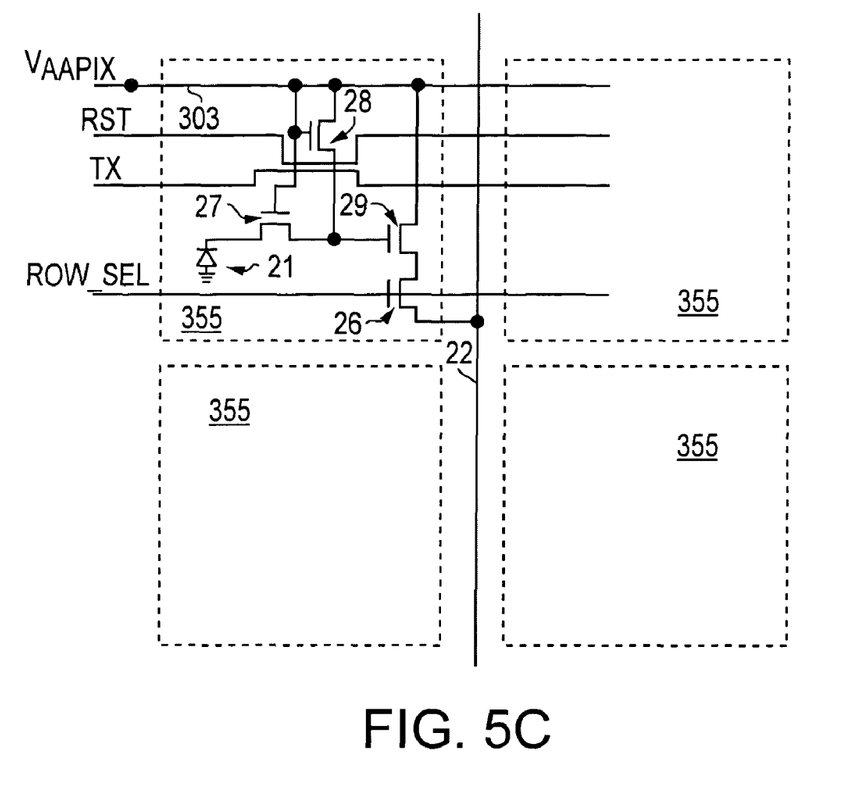
FIG. 5C is a schematic diagram of pixel cells of FIG. 4B according to an exemplary embodiment of the invention.

FIG. 5C is a schematic diagram of the columns 316, including a detailed diagram of a guard column pixel cell 355. Similar to a conventional active array pixel cell 20, each guard column pixel cell 355 includes a transfer transistor 27, a floating diffusion region 25, a reset transistor 28, a source follower transistor 29, and a row select transistor 26. The guard column pixel cell 355, however, includes different connections and, therefore, operates differently than active array pixel cell 20, as described in more detail below.

The guard column pixel cell 355 is similar to the guard row pixel cell 353, except that in the guard column pixel cell 355 the gate of the row select transistor 26 is not coupled to a ground potential. Additionally, connections (e.g., metal lines) are provided over the guard column pixel cells 355 to supply TX and RST signals to the active array pixel cells 20, black pixel cells 20', and buffer pixel cells, 20" located in the same row as the guard column pixel cell 355. Accordingly, as shown in FIG. 5C, the gates of the transfer and reset transistors 27, 28 are coupled to the Vaa-pix rail 303, in contrast to the active array pixel cells 20 (FIGS. 2A and 2B).

Excess charge (e.g., blooming charge from the active array pixel cells 20) is collected in the photo-conversion devices 21 of the guard pixel cells 353, 355. Since the gates 27a, 28a of the transfer and reset transistors 27, 28 are coupled to the Vaa-pix rail 303, the gates are held open. That is, the gates 27a, 28a are continuously operated. Therefore, charge in the photodiode 21 and the floating diffusion region 25 is drained from the pixel cells 353, 355 through the Vaa-pix rail 303. In this manner, the guard pixel cells 353, 355 serve to isolate the black pixel cells 20' from interference, particularly from interference from the active array pixel cells 20. Further, the connection to the Vaa-pix rail 303 creates a gradient in the electric field of the photodiode 21 and floating diffusion region 25 with respect to the substrate (not shown), which is biased at a ground potential. The electrical gradient promotes the collection of negative photon-generated charge (e.g., blooming charge from adjacent pixel cells 20) in the photodiode 21 and the floating diffusion region 25, where it is removed via the Vaa-pix rail 303.

The guard pixel cells 353, 355 can be formed similarly to the other pixel cells 20, 20', 20" of the array, except that the guard pixel cells 353, 355 are formed having the connections described above with reference to FIGS. 5A-5C. Also, the guard pixel cells 353, 355 can be formed concurrently with the other pixel cells 20, 20', 20". In one embodiment of the invention, the pixel cells 353, 355 are formed by known methods on a substrate (not shown).

Although the image sensor 300 is shown including black region 313 having pixel cells 20', 20", 353 arranged in rows and black region 315 having pixel cells 20', 20", 355 arranged in columns, embodiments of the invention include an image sensor 300 having additional or fewer black regions 313, 315. For example, the image sensor 300 can include only one of the first or second black regions 313, 315, if desired.

Figure 6:
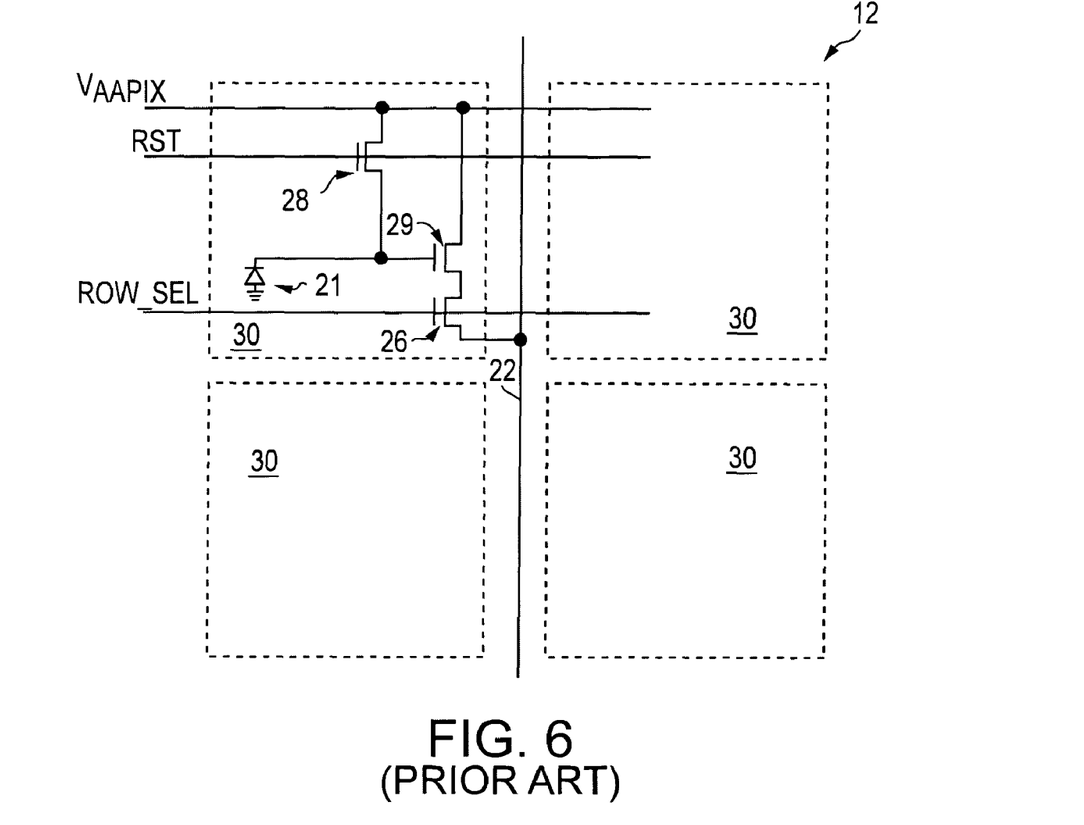
FIG. 6 is a schematic diagram of additional conventional CMOS pixel cells.
Figure 7A:
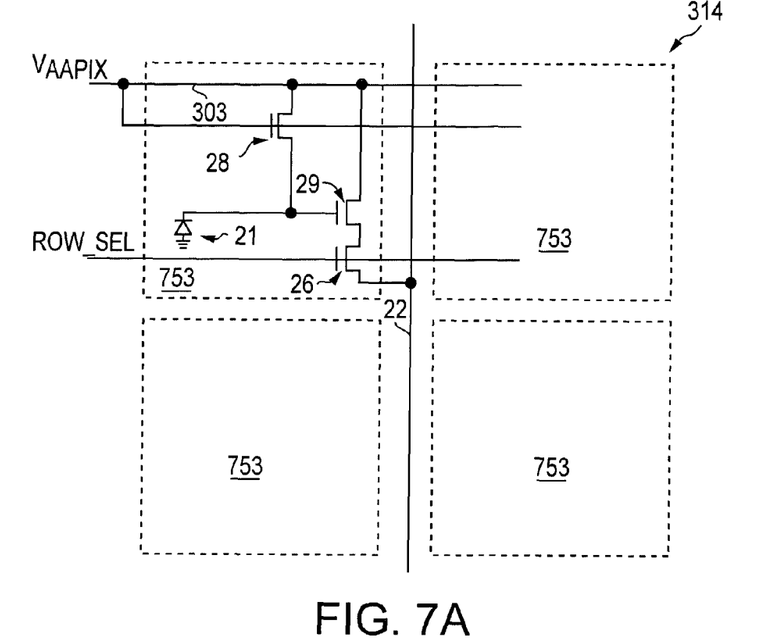
FIGS. 7A and 7B are schematic diagrams of pixel cells according to additional exemplary embodiments of the invention.
Figure 7B:
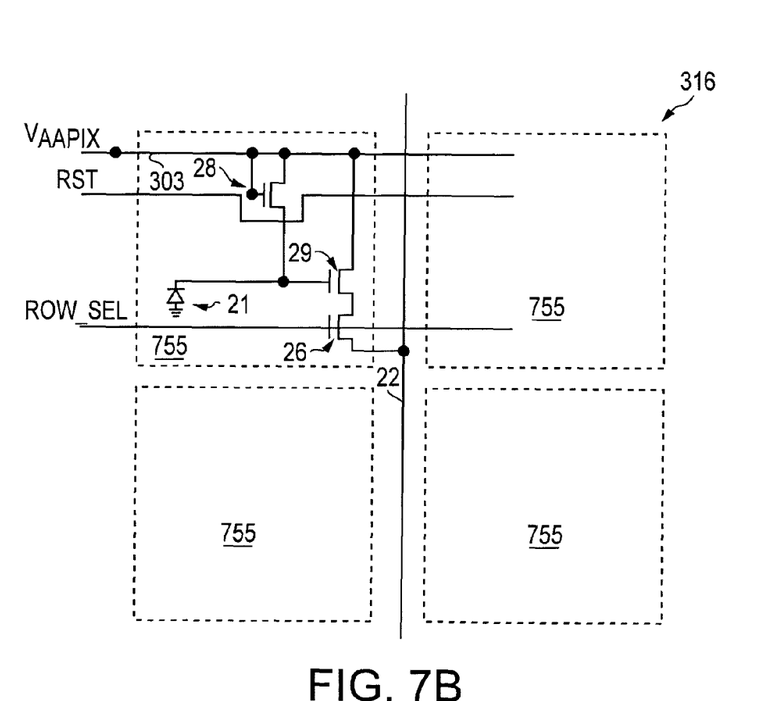

According to another exemplary embodiment of the invention, the image sensor 300 can include active array pixel cells having configurations other than a 4T configuration. For example, the image sensor can include active array pixel cells 30 having a three-transistor (3T) configuration, as shown in FIG. 6, instead of active array pixel cells 20. The 3T active array pixel cell 30 is known in the art and differs from the 4T active array pixel cell 20 (FIG. 2A) by the absence of the transfer transistor 27. The image sensor 300 can also include black pixel cells and buffer pixel cells having 3T configurations (not shown), instead of 4T pixel cells 20', 20". Further, the image sensor 300 can include guard row pixel cells 753 and guard column pixel cells 755 having 3T configurations, as shown in FIGS. 7A and 7B, instead of 4T guard pixel cells 353, 355.

The 3T guard row pixel cells 753 are similar to the 4T guard row pixel cells 353, except that the 3T guard row pixel cells 753 lack a transfer transistor 27. Accordingly, as shown in FIG. 7A, the gates of the reset transistors 28 are coupled to a power supply voltage (Vaa-pix) rail 303. This is in contrast to the 3T active array pixel cell 30 (FIG. 6), where the gate reset transistor 28 receives RST signals. Also, if desired, the gate 26a (FIG. 5B) of the row select transistor 26 can be coupled to a ground potential.

Likewise, 3T guard column pixel cells 755 are similar to the 4T guard column pixel cells 355, except that the 3T guard column pixel cells 755 lack a transfer transistor 27. Accordingly, as shown in FIG. 7B, the gate 28a (FIG. 5B) of the reset transistor 28 is coupled to the Vaa-pix rail 303, in contrast to the 3T active array pixel cells 30 (FIG. 6).

It should be noted that the configuration of the pixel cells 20, 30, 20', 20", 353, 355, 753, 755 is only exemplary and that various changes may be made as are known in the art and pixel cells of the image sensor 300 may have other configurations. For example, although the invention is described in connection with four-transistor (4T) guard pixel cells 353, 355 and three-transistor (3T) guard pixel cells 753, 755, the invention may also be incorporated into other pixel circuits having different numbers of transistors. Without being limiting, such a circuit may include five-transistor (5T) pixel cell, six-transistor (6T), and seven-transistor (7T) guard pixel cells. The 5T, 6T, and 7T guard pixel cells would differ from the 4T pixel cell by the addition of one, two, or three transistors, respectively, such as a shutter transistor, a CMOS photogate transistor, and an anti-blooming transistor.

In each case, the gates of the transistor(s) connected to the photo-conversion device and the floating diffusion region would be coupled to a power supply voltage (e.g., Vaa-pix) such that charge from the photo-conversion device and the floating diffusion region is drained from the guard pixel cells through the connection to the power supply voltage. For example, when a guard pixel cell 353, 355 further includes an anti-blooming transistor (not shown) connected to the photodiode 21, the gate of the anti-blooming transistor would be coupled to Vaa-pix.

Also, while the above embodiments are described in connection with p-n-p-type photodiodes the invention is not limited to these embodiments. The invention also has applicability to other types of photo-conversion devices, such as a photodiode formed from n-p or n-p-n regions in a substrate, a photogate, or a photoconductor. If an n-p-n-type photodiode is formed the conductivity types of all structures would change accordingly.

Figure 8:
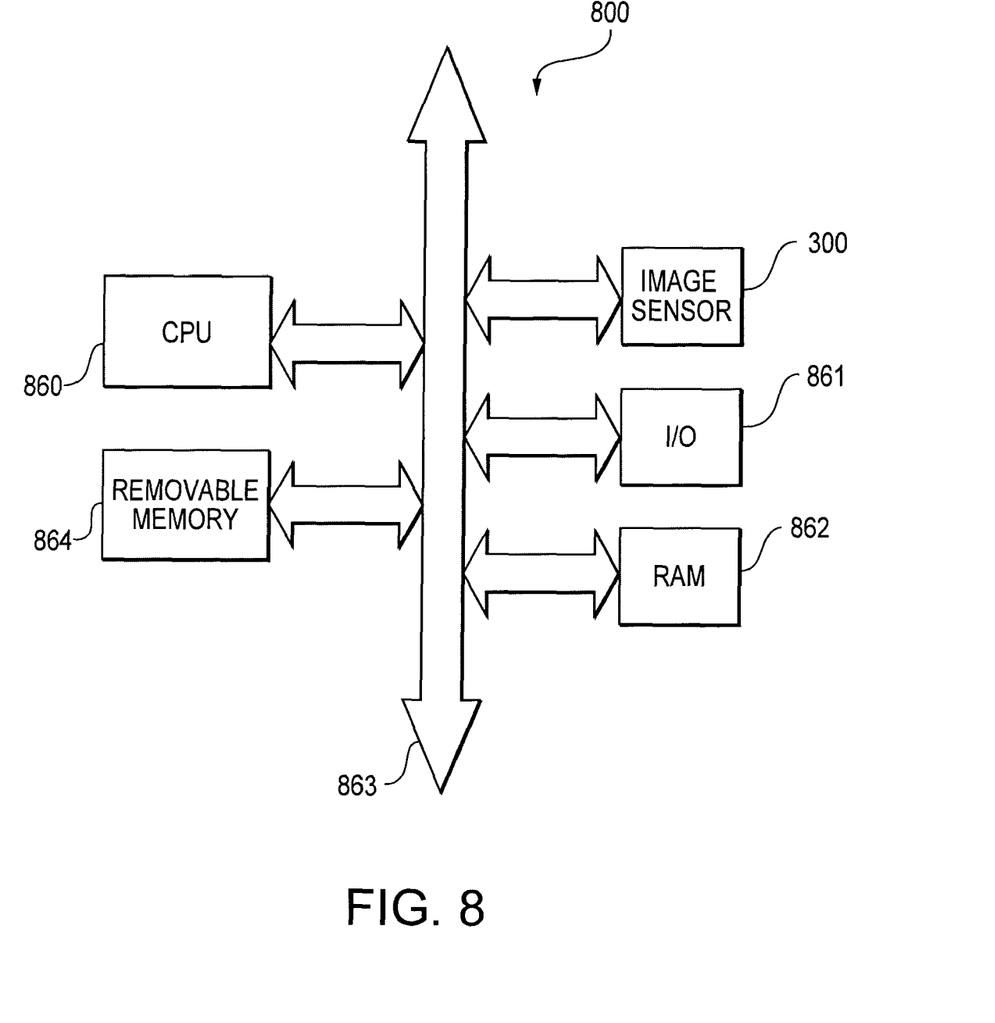
FIG. 8 is a block diagram of a processor system according to an exemplary embodiment of the invention.

FIG. 8 illustrates a processor-based system 800 including an image sensor 300 of FIG. 3 having guard pixel cells 353, 355 (FIGS. 5A-5C). Instead, as described above, the image sensor 300 could include guard pixel cells 753, 755 (FIGS. 7A and 7B). The processor-based system 800 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 800, for example a camera system, generally comprises a central processing unit (CPU) 860, such as a microprocessor, that communicates with an input/output (I/O) device 861 over a bus 863. Image sensor 300 also communicates with the CPU 860 over bus 863. The processor-based system 800 also includes random access memory (RAM) 862, and can include removable memory 864, such as flash memory, which also communicate with CPU 860 over the bus 863. Image sensor 300 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
    a photo-conversion device; and
    at least one first transistor directly connected to the photo-conversion device for dissipating charge therefrom, each first transistor having a gate driven only by a power supply voltage, wherein one first transistor comprises a first source/drain region common to a second transistor, the first source/drain region directly coupled to a gate of a source follower transistor, the second transistor further comprising a gate configured to be driven only by the power supply voltage and a second source/drain region coupled to the power supply voltage.

2. The pixel cell of claim 1, wherein there is one first transistor coupled to the photo-conversion device.

3. The pixel cell of claim 2, wherein the first transistor is one of a reset, anti-blooming, or transfer transistor.

4. A pixel cell comprising:
    a photo-conversion device;
    at least one first transistor coupled to the photo-conversion device for dissipating charge therefrom, each first transistor having a first source/drain region coupled to the photo-conversion device and comprising a body and a gate, the gate driven by a power supply voltage; and
    a second transistor, the second transistor comprising a body and a gate, the gate configured to be driven only by a ground potential, and having a source/drain region directly connected to a column output line.

5. A method of forming a pixel cell, the method comprising the acts of:
    forming a photo-conversion device;
    forming at least one first transistor directly connected to the photo-conversion device;
    forming connections coupling a gate of each first transistor to a power supply voltage such that the gate of each first transistor is configured to be driven only by the power supply voltage;
    forming a first source/drain region of at least one first transistor to be common to a second transistor;
    forming a connection directly coupling the first source/drain region to a gate of a source follower transistor;
    forming the second transistor; and
    forming connections coupling a gate and second source/drain region of the second transistor to the power supply such that the gate of the second transistor is configured to be driven only by the power supply voltage.

6. The method of claim 5, wherein the act of forming the at least one first transistor comprises forming at least one of a reset, transfer, and anti-blooming transistor.

7. A method of forming a pixel cell, the method comprising the acts of:
    forming a photo-conversion device;
    forming at least one first transistor coupled to the photo-conversion device;
    forming connections coupling a gate of each first transistor to a power supply voltage such that the gate of each first transistor is driven only by the power supply voltage;
    forming a second transistor comprising a body and a gate;
    forming connections coupling a source/drain region of the second transistor to a column output line; and
    forming a connection directly connecting the gate of the second transistor to a ground potential such that the gate of the second transistor is configured to be driven only by the ground potential.

8. A method of operating a pixel cell, the method comprising the acts of:
    preventing light from reaching a photo-conversion device;
    collecting charge in the photo-conversion device;
    continuously operating a gate of each transistor coupled to the photo-conversion device, such that the gate is always held open during operation, each transistor directly connected to the photo-conversion device being a first transistor;
    draining the charge from the photo-conversion device, wherein at least one first transistor comprises a first source/drain region common to a second transistor, the first source/drain region directly coupled to a gate of a source follower transistor; and
    continuously operating a gate of the second transistor, the second transistor having a second source/drain region coupled to a power supply voltage rail and a gate connected directly only to the power supply voltage rail, wherein draining the charge comprises draining the charge to the power supply voltage rail coupled to the source/drain region of the second transistor.

9. The method of claim 8, wherein the act of continuously operating the gate of each first transistor comprises applying a power supply voltage to the gate of each first transistor.

* * * * *